(12) United States Patent
Jackson et al.

(10) Patent No.: US 7,035,140 B2
(45) Date of Patent: Apr. 25, 2006

(54) ORGANIC-POLYMER MEMORY ELEMENT

(75) Inventors: Warren B. Jackson, San Francisco, CA (US); Sven Moller, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 70 days.

(21) Appl. No.: 10/758,992

(22) Filed: Jan. 16, 2004

(65) Prior Publication Data

US 2005/0157535 A1    Jul. 21, 2005

(51) Int. Cl.
*G11C 11/34*    (2006.01)

(52) U.S. Cl. ............ 365/174; 365/151; 365/129; 257/40; 257/642; 257/759; 438/99; 438/623; 438/725

(58) Field of Classification Search ............ 365/174, 365/151, 129; 257/40, 642, 759; 438/99, 438/623, 725

See application file for complete search history.

(56) References Cited

U.S. PATENT DOCUMENTS

| | | | |
|---|---|---|---|
| 6,503,831 B1 * | 1/2003 | Speakman | 438/674 |
| 6,656,763 B1 * | 12/2003 | Oglesby et al. | 438/99 |
| 6,686,263 B1 * | 2/2004 | Lopatin et al. | 438/584 |
| 6,753,247 B1 * | 6/2004 | Okoroanyanwu et al. | 438/623 |
| 6,806,526 B1 * | 10/2004 | Krieger et al. | 257/296 |
| 6,838,720 B1 * | 1/2005 | Krieger et al. | 257/296 |
| 6,852,586 B1 * | 2/2005 | Buynoski et al. | 438/238 |
| 2003/0178667 A1 | 9/2003 | Krieger | |

FOREIGN PATENT DOCUMENTS

WO    WO01/27972 A2    4/2001

* cited by examiner

*Primary Examiner*—Viet Q. Nguyen

(57) ABSTRACT

Embodiments of organic-polymer-based memory elements that are stable to repeated READ access operations are disclosed. Organic-polymer-based memory elements can suffer cumulative degradation that occurs over repeated READ access operations due to the introduction of electrons into the organic-polymer layer. In general, entry of electrons into the organic-polymer layer generally lags initiation of a hole current within the organic-polymer layer following application of a voltage potential across the memory elements. Therefore, stable memory elements can be fabricated by introducing electron-blocking layers and/or limiting the duration of applied voltages during READ access operations.

23 Claims, 15 Drawing Sheets

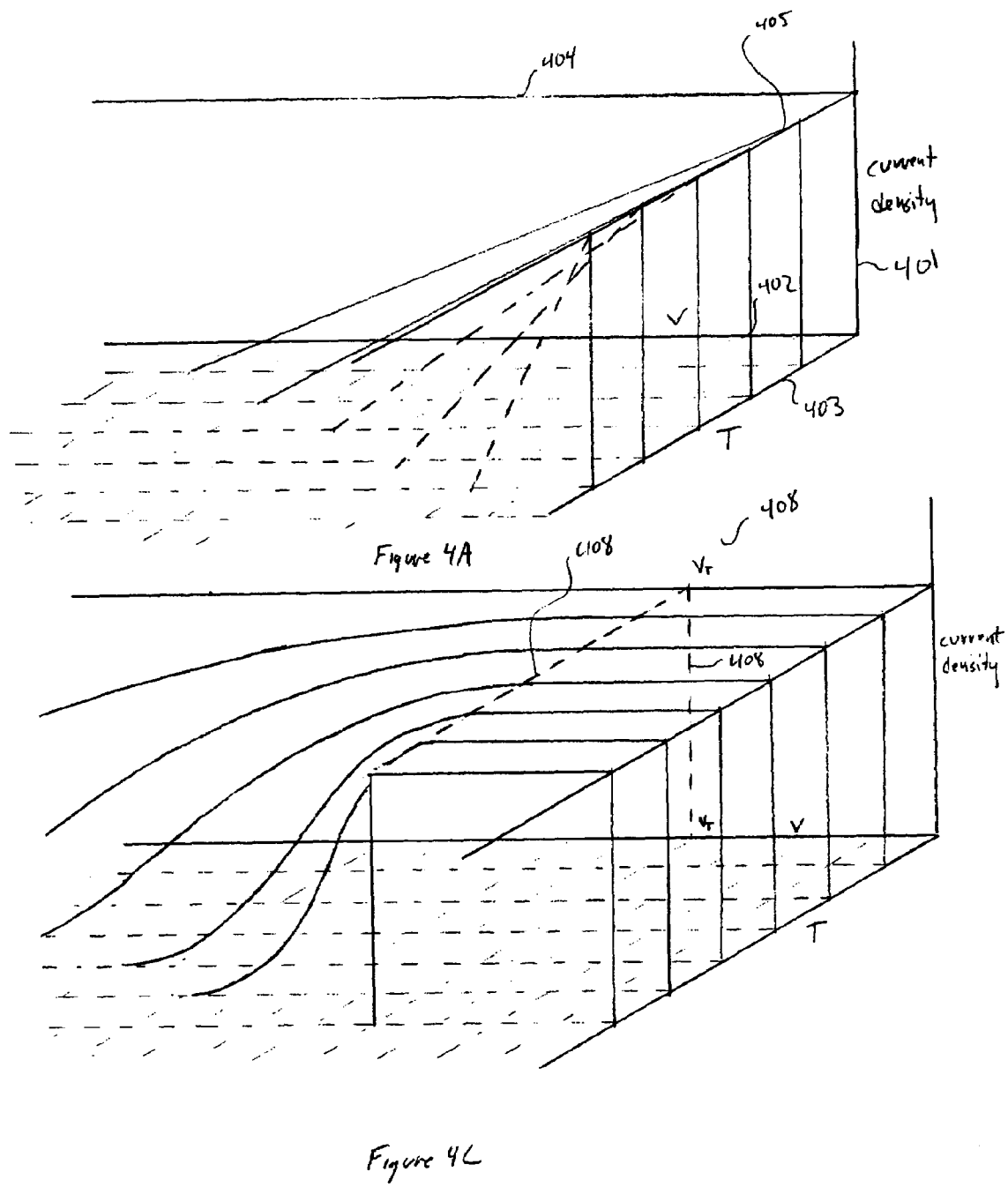

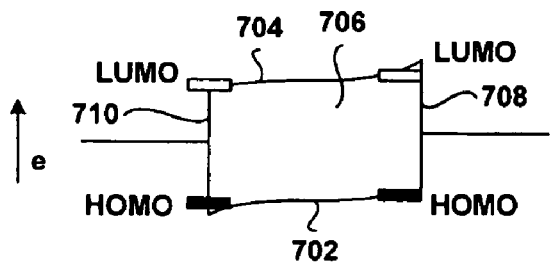
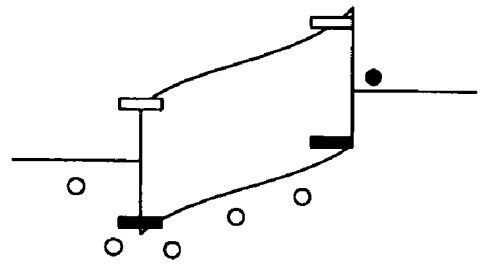
Figure 7A  Figure 7B
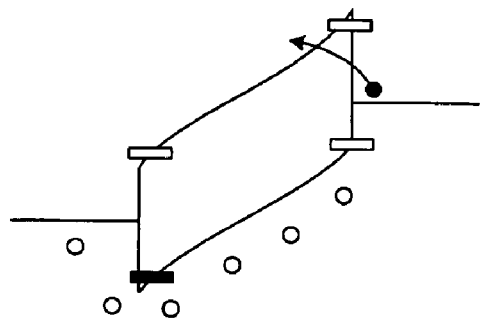
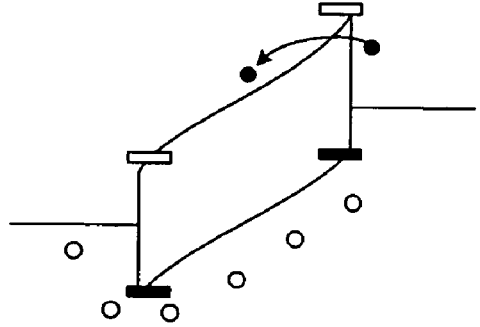
Figure 7C  Figure 7D
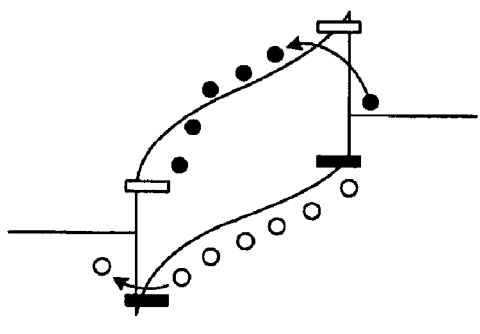
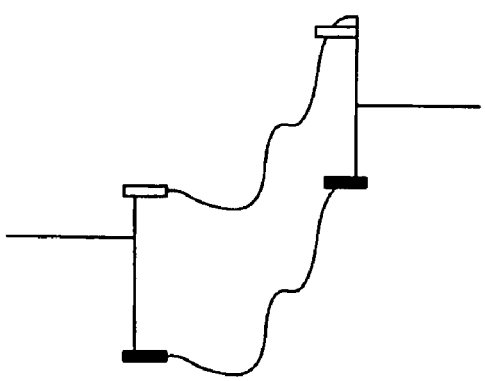
Figure 7E  Figure 7F

ORGANIC-POLYMER MEMORY ELEMENT

TECHNICAL FIELD

The present invention relates to electronic memories and, in particular, to memories and other electronic devices that employ a conductive-polymer-based memory element that can be stably and repeatedly accessed to read information stored in the memory element.

BACKGROUND OF THE INVENTION

Two-state electronic switches are widely used in modem electronics, from basic circuits to microprocessors and electronic memories. An electronic memory comprises a large number of ordered and electronically indexed switches, the state of each switch representing a binary "1" or "0" value or, in other words, a bit of information. Many different types of electronic memories are currently used in computers, in various types of intelligent electronic devices and controllers, and in many popular commercial products, including digital cameras and video recorders. While many applications require dynamic electronic memories that can be repeatedly written and read, many other applications require only static electronic memories that can be written only once, and then read repeatedly. Example write-once, read-many-times ("WORM") memory devices include commonly used and optically accessed write-once compact discs, various well-known, read-only memories ("ROMs"), and various types of electronically accessed, microfuse-based crosspoint memories. WORM memories may be significantly less expensive than memories that can be repeatedly read and written, and may find great utility in applications requiring large, robust and resilient memory devices, including digital photography, where inexpensive WORM memories may be used for storing digital images in a fashion analogous to storing analogue optical images on photographic film.

FIG. 1 illustrates a recently disclosed type of organic-polymer-based memory element. The organic-polymer-based electronic-memory element comprises a p-type organic-polymer semiconductor layer 102 sandwiched between conductive signal lines 104–105. An additional n-type semiconductor layer 106 separates the p-type organic-polymer semiconductor layer from one of the signal lines, forming a pn-junction at the interface with the p-type organic-polymer semiconductor layer that acts as a diode to select for flow of current through the memory element in only one direction. In its initial post-fabrication state, the organic polymer layer is relatively highly conductive, conducting current with relatively low resistance between the two conductive signal lines, or conductive elements, when a voltage differential is applied to the conductive elements. This highly conductive state of the organic polymer constitutes a first stable state of the memory element that can serve to represent a binary bit "1" or "0," depending which of two possible binary encoding conventions is employed.

A relatively high voltage pulse can be passed between the two conductive elements, resulting in a marked decrease in the current-carrying capacity of the organic polymer layer sandwiched between the two conductive elements. This change in conductivity of the organic polymer layer is generally irreversible, and constitutes a second stable state of the memory element that may be used to encode a binary bit "0" or "1," again depending on which of two possible encoding conventions are employed, opposite from the binary bit encoded by the first stable state. A two-dimensional array of organic-polymer-based memory elements is obtained by forming a first layer of parallel, conductive signal lines, coating the first layer of parallel conductive signal lines with a layer of a first semiconductor, such as an n-type doped silicon layer, applying the organic polymer layer, and then fabricating a second layer of conductive signal lines on top of the organic polymer layer, the signal lines of the first layer oriented at an angle with respect to the signal lines of the second layer of generally between 30 and 120 degrees. Each overlap of a signal line in the first layer of signal lines with a signal line in the second layer of signal lines, along with the semiconductor and organic polymer layers between the signal lines of the first and second layer in the overlap region, constitutes a single memory element. The memory element is written with a high-voltage spike, to change the conductivity of the organic polymer layer from high to low, and is read at a low voltage sufficient to detect the difference in conductivity between the high conductivity and low conductivity states.

FIG. 2 shows the chemical structure of the PEDT/PSS polymer mixture, known by the trade name Baytron® P. The PEDT/PSS conductive polymer mixture is a mixture of a poly(3,4-ethylenedioxythiophene) polymer 202 and poly (styrene sulfonate) polymers 204. Baytron® P is prepared as an aqueous dispersion of a mixture of PEDT and PSS polymers. In general, the PEDT/PSS aqueous dispersion is spun onto a surface, to which it adheres upon drying to form an intrinsically conductive, transparent, and virtually colorless coating. PEDT/PSS has relatively high conductivity for an organic polymer, and can support current densities of greater than 200 amperes per $cm^2$. PEDT/PSS has good photo stability and good thermal stability, and is relatively resistant to hydrolysis, and is therefore suitable for use as the p-type organic-polymer semiconductor layer 102 in the memory element illustrated in FIG. 1.

Unfortunately, repeated read access of memory elements of the type illustrated in FIG. 1 has revealed that, over time, even the low voltages employed for read access of the memory element result in degradation of the organic-polymer layer. When the memory element has, for example, a high conductivity state representing one of the two binary values, repeated read access may result in the memory element transitioning to a low conductivity state, and thus corrupting the information stored within the memory element. Designers and manufacturers of high-density electronic memories, and other memory-element-containing electronic devices, have therefore recognized the need for an organic-polymer-based memory element that is stable over repeated stored-information-access operations.

SUMMARY OF THE INVENTION

The present invention provides various embodiments of organic-polymer-based memory elements that are stable to repeated READ access operations. Investigation of the organic-polymer-based memory elements has revealed that the cumulative degradation that occurs over repeated READ access operations can be attributed to the introduction of electrons into the organic-polymer layer. These investigations have also shown that, in general, entry of electrons into the organic-polymer layer generally lags initiation of a hole current within the organic-polymer layer following application of a voltage potential across the memory elements. Therefore, stable memory elements can be fabricated by introducing electron-blocking layers and/or limiting the duration of applied voltages during READ access operations.

BRIEF DESCRIPTION OF THE DRAWINGS

FIGS. 6, 7A–F, and 8A–F illustrate the physical processes that occur in the PEDT/PSS organic-polymer layer when voltage is applied to the PEDT/PSS organic-polymer layer.

DETAILED DESCRIPTION OF THE INVENTION

One embodiment of the present invention is a WORM memory element, comprising a thin layer of a p-type organic-polymer semiconductor sandwiched, in many embodiments, between additional layers that, in turn, are in contact with two electrodes. A suitable, conductive, p-type organic-polymer semiconductor is obtained from a two-component, conductive polymer mixture including poly(3,4-thylenedioxythiophene) and poly(styrene sulfonate) ("PEDT/PSS"). The PEDT/PSS layer is relatively highly conductive following initial fabrication. However, the PEDT/PSS layer can be subjected to a relatively high voltage pulse to be irreversibly switched to a low conductivity state. Both states are stable when subjected to relatively low-voltage currents that can be employed to query the state of the memory element, for relatively short periods of time. In various embodiments of the present invention, the additional layers act as electron and electron-and-hole blockers to prevent READ access of the memory element from slowly degrading a high-conductive-state PEDT/PSS layer to a low-conductive state, thereby corrupting the information stored in the memory, and the additional layers may also include, in certain embodiments, hole and hole-and-electron generators. In other embodiments, the voltage or current applied across the memory element for READ access is limited in time to a READ threshold to prevent READ access of the memory element from slowly degrading a high-conductive-state PEDT/PSS layer to a low-conductive state. In certain embodiments, both electron and electron-and-hole blockers and limited-in-time voltages or currents are employed in order to ensure that large electron fluxes do not enter the organic polymer layer during READ access operations.

Figure 1:
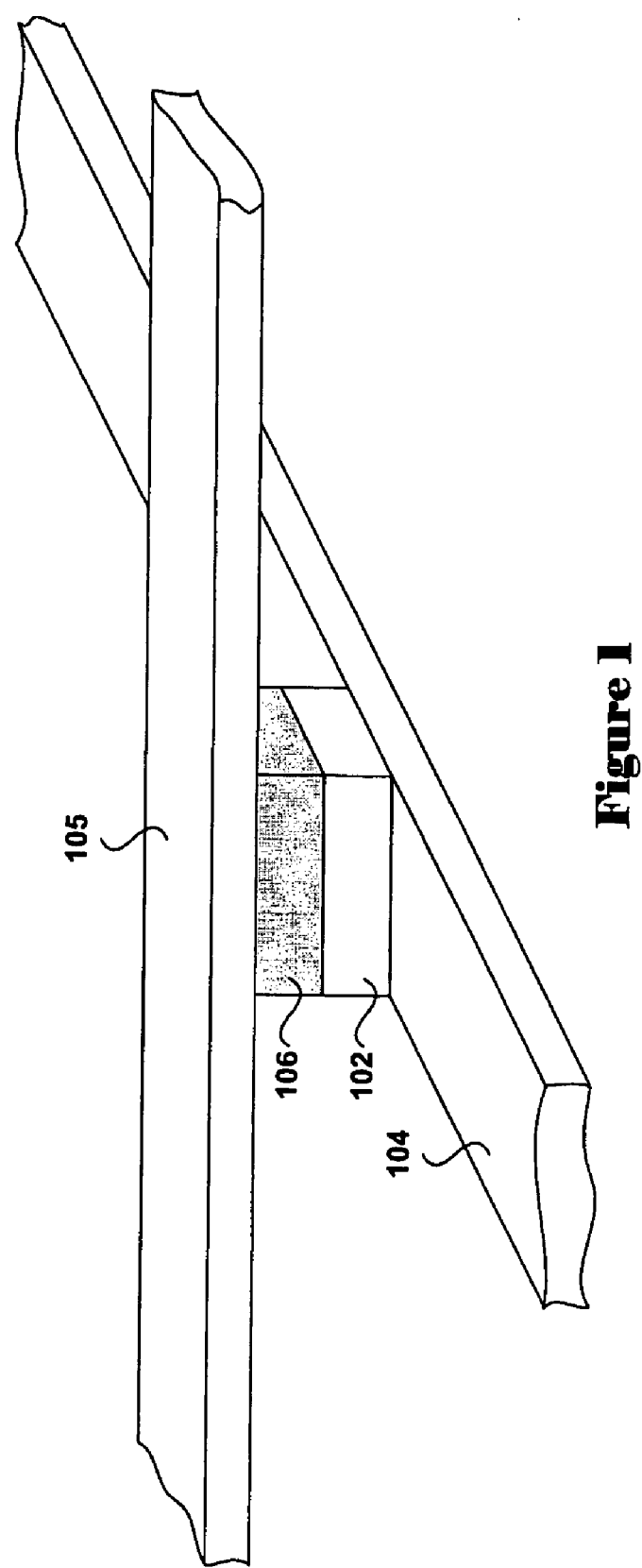
FIG. 1 illustrates a recently disclosed type of organic-polymer-based memory element.
Figure 2:
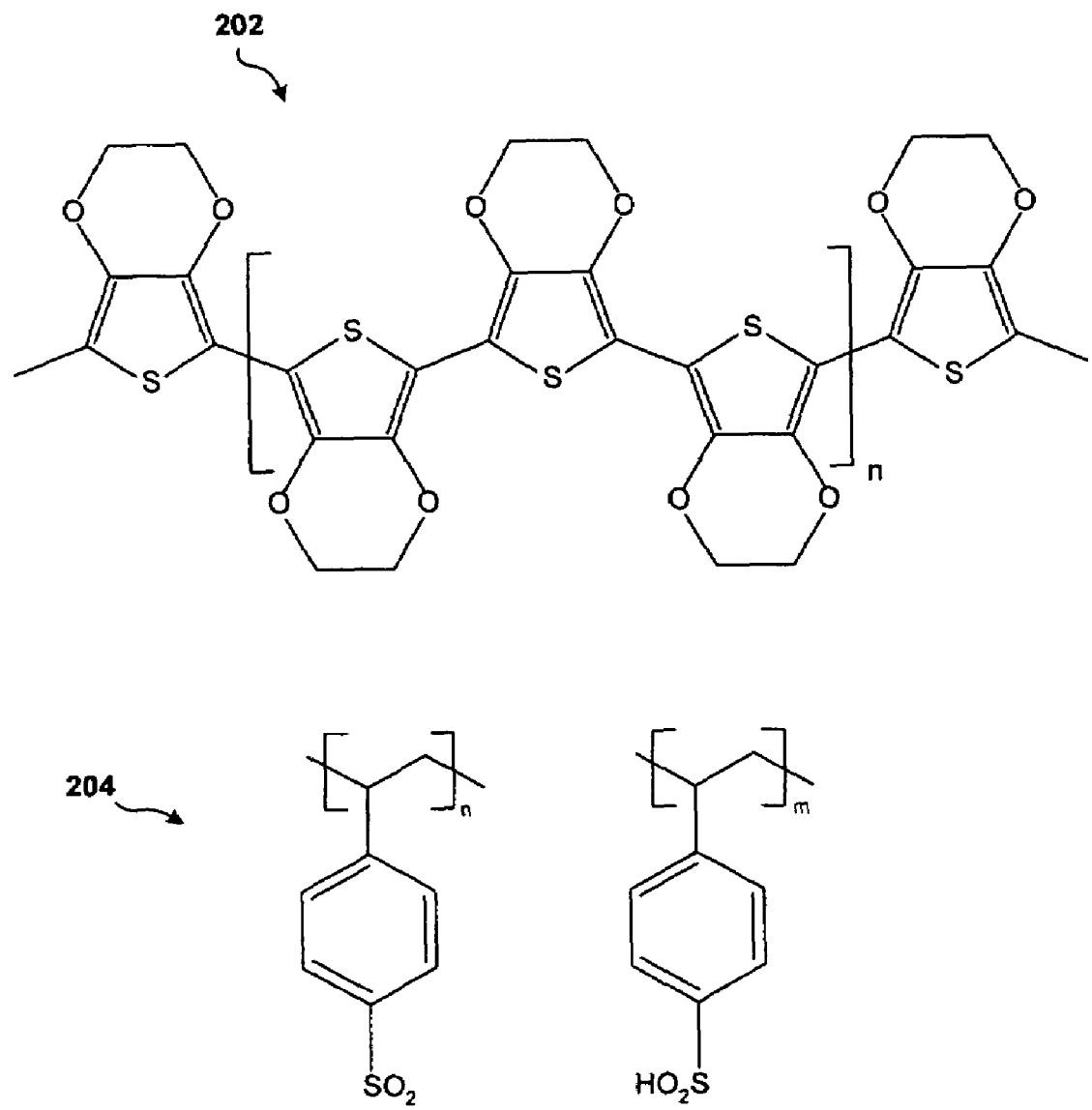
FIG. 2 shows the chemical structure of a PEDT/PSS polymer mixture.
Figure 3:
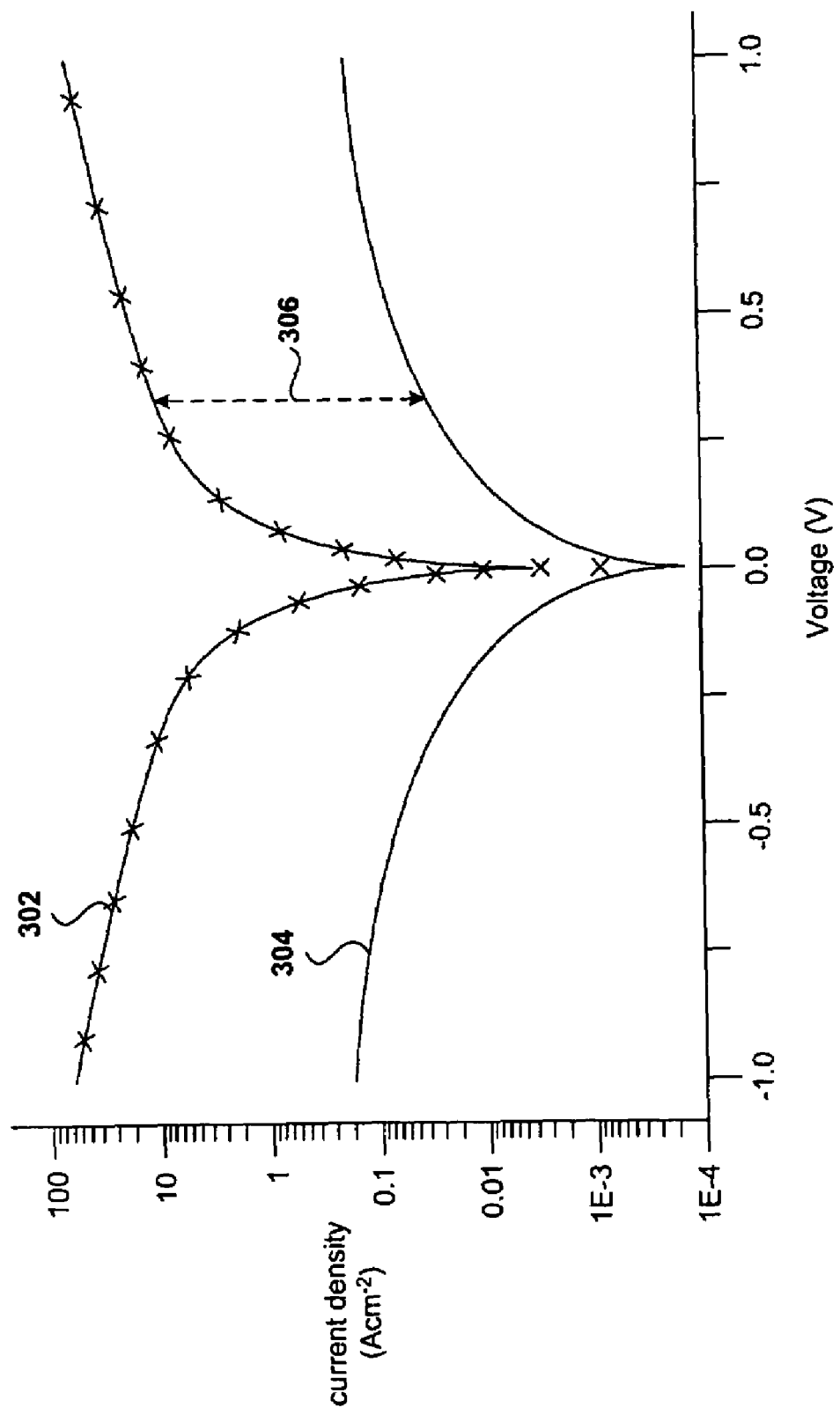
FIG. 3 illustrates the conductivity state transition of the organic-polymer layer of the memory element illustrated in FIG. 1.

FIG. 3 illustrates the conductivity state transition of the organic-polymer layer of the memory element illustrated in FIG. 1. In its initial, post-manufacturing state, prior to exposure to high voltages, the organic-polymer layer exhibits the current-density/voltage relationship shown in FIG. 3 as curve 302. Following exposure of the organic-polymer layer to high voltages, the organic-polymer layer exhibits the current-density/voltage relationship shown in FIG. 3 as curve 304. There is a conductivity difference 306 between the highly conductive and low conductive states of the organic-polymer layer of approximately three orders of magnitude.

Figure 4B:
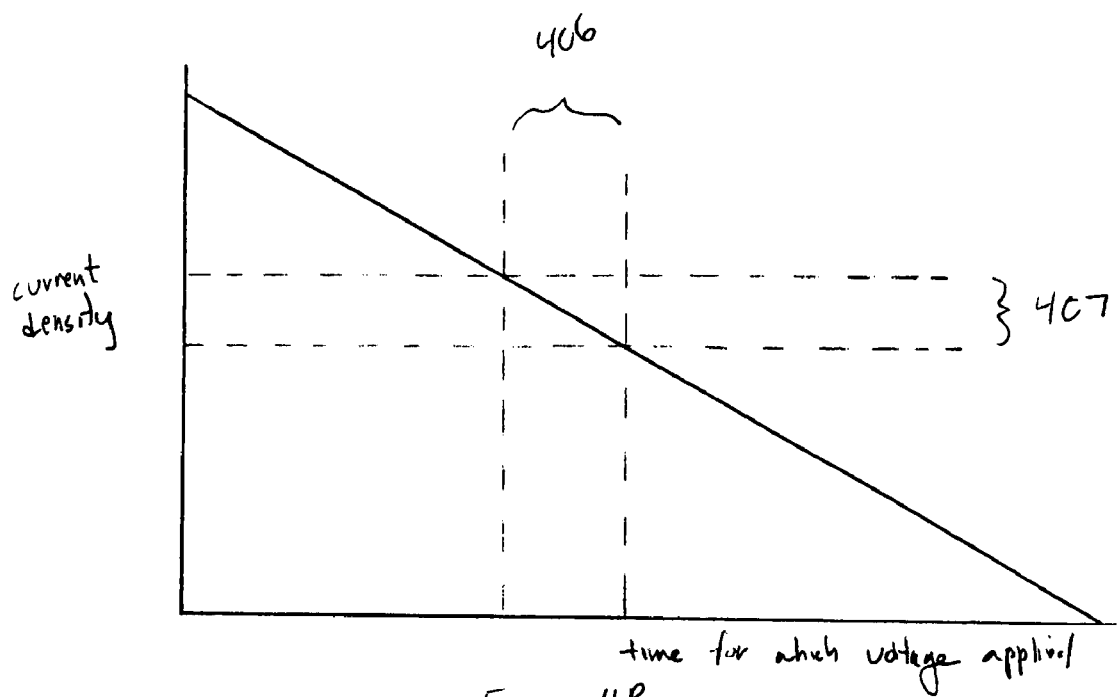
FIGS. 4A–E illustrate desirable switching properties for a bistable organic-polymer layer.

FIGS. 4A–E illustrate desirable switching properties for a bistable organic-polymer layer. FIG. 4A shows a three-dimensional plot of a current-density surface, with resulting current density plotted with respect to the z-axis 401 following application of a voltage level plotted with respect to the x-axis 402 for a period of time plotted with respect to the y-axis 403, for a linear-response, conductivity-based, memory-device material. As shown in FIG. 4A, the resulting current density, or conductivity, is constant for the material when either the time of application is 0 (horizontal line 404) or the applied voltage is 0 (horizontal line 405), but declines roughly linearly when any nonzero voltage is applied for a nonzero amount of time, with the decline increasingly steeper for increasingly larger voltages and for increasingly large periods of time. A yz slice of the volume shown in FIG. 4A, with constant voltage x>0, is shown in FIG. 4B, with the z-axis vertical and the y-axis horizontal. The linear relationship shown in FIG. 4B represents the decrease in current density, or conductivity, of the linear-response, conductivity-based, memory-device material with respect to the amount of time y a fixed voltage x is applied to the material. It is important to note that, for even a single, short application, the current density of the material decreases. Thus, even when a relatively low voltage is used for READ access of the current-density state of the material, the READ access nevertheless results in a small decrease in current density. Multiple repeated READ accesses of the material in a conductive state may cause the current density to fall below a threshold level separating the conductive state from the non-conductive state, essentially corrupting the information stored as a conductive state in the material. Another problem with a linear-response, conductivity-based, memory-device material is that, over a defined time-of-voltage-application-interval 406, the current density decreases relatively modestly 407. This modest decrease in current density may lead either to problems in differentiating a high-conductivity state from a low-conductivity state, or require a large, threshold time-of-voltage-application-interval in order to alter the conductivity state of the material, leading to slow WRITE access operations.

Figure 4D:
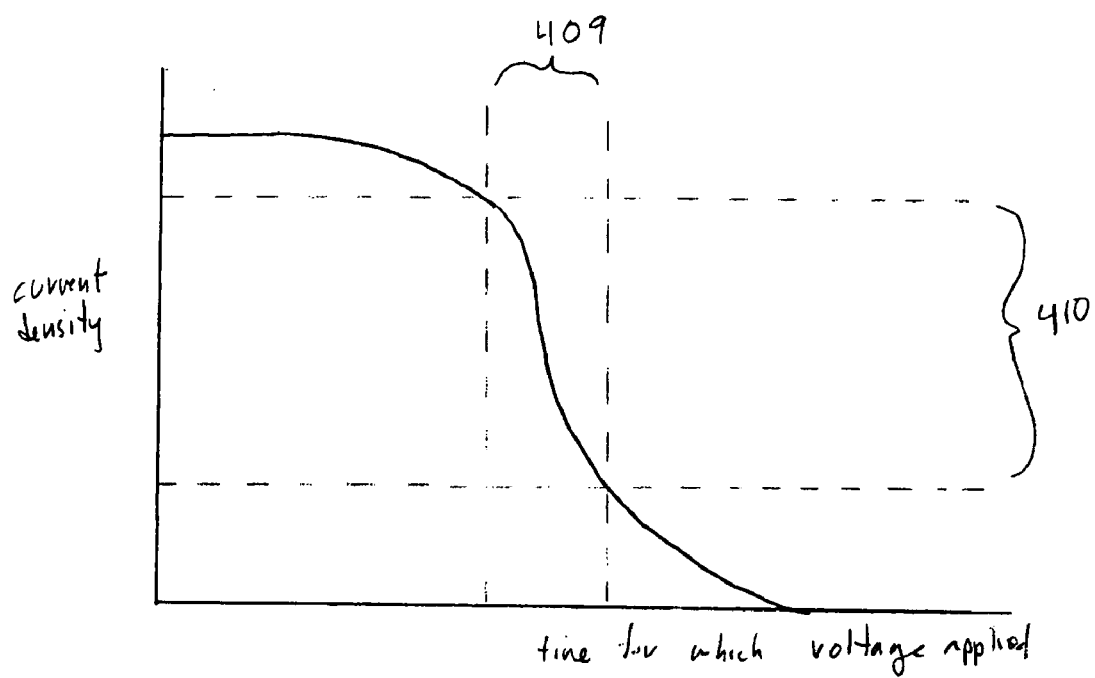
Figure 4:
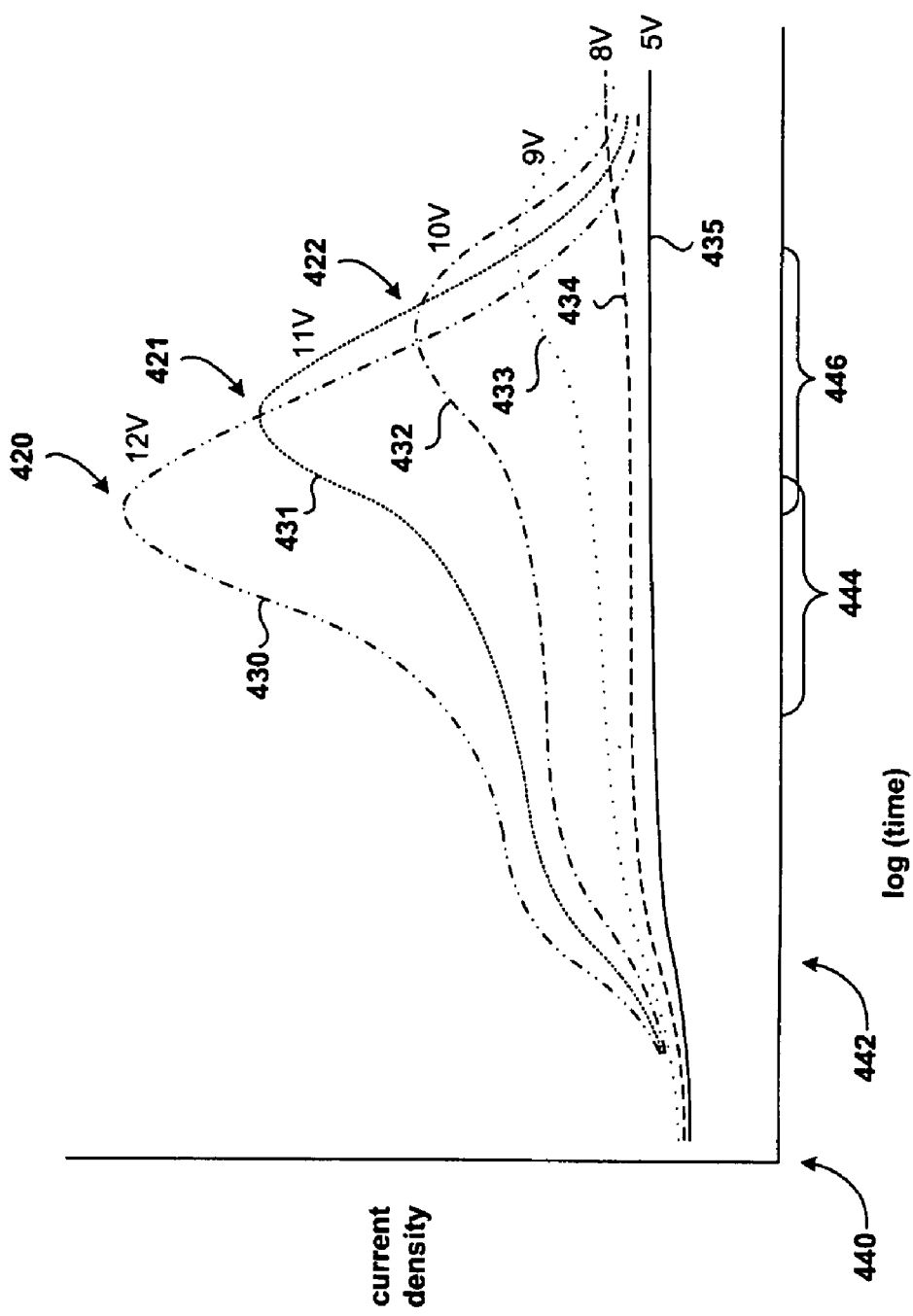

FIG. 4C, using the same drawing and labeling conventions used for FIG. 4A, shows a three-dimensional plot of a current-density surface, with resulting current density plotted with respect to the z-axis following application of a voltage level plotted with respect to the x-axis for a period of time plotted with respect to the y-axis for a nonlinear-response, conductivity-based, memory-device material. For a nonlinear-response, conductivity-based, memory-device material, there is a threshold voltage $V_t$ 408 below which, regardless of how long a low voltage is applied, no resulting current-density decrease is observed. At voltages greater than the threshold voltage $V_t$, the current density decreases relatively steeply, either as a greater-than-threshold voltage is applied for increasingly large amounts of time, or increasing voltages are applied for a fixed, nonzero amount of time. A yz slice of the volume shown in FIG. 4A, with a constant, modest voltage x>0, is shown in FIG. 4D, with the z-axis vertical and the y-axis horizontal. The sigmoidal relationship shown in FIG. 4D represents the decrease in current density, or conductivity, of the nonlinear-response, conductivity-based, memory-device material with respect to the amount of time y a fixed voltage x is applied to the material. It is important to note that, for short-duration applications, the current density of the material does not decrease. Thus, if a relatively low voltage is used for READ access of the current-density state of the material, multiple repeated READ accesses to the material in a conductive state does not cause the current density to fall below a threshold level separating the conductive state from the non-conductive state, therefore preserving the information stored as a conductive state in the material. Another advantage of the nonlinear-response, conductivity-based, memory-device material is that, over a defined time-of-voltage-application-interval 409, a very large current-density decrease 407 is observed. This large decrease in current density leads to well-differentiated high-conductivity and low-conductivity states, and a large threshold time-of-voltage-application-interval is not needed in order to alter the conductivity state of the material, leading to fast WRITE-access operations. An xz slice of the three-dimensional volume would show a similar sigmoidal relationship, showing that well-differentiated conductivity states can be obtained from a nonlinear-response material over a relatively small difference in applied voltages.

FIGS. 4A–4D show hypothetical curves for an initial decrease in current density following a first application of a voltage. Similar, but perhaps differently shaped curves may be observed for second and subsequent voltage applications, depending on the material.

FIG. 4E shows the time-dependent current density within the organic-polymer layer of the memory element shown in FIG. 1 at various applied voltages. At time t=0 (440), a voltage is applied to the organic-polymer layer, each curve in FIG. 4E 430–435 representing application of a different voltage, descending from 12 volts, represented by curve 430, to 5 volts, represented by curve 435. In the higher-applied-voltage cases, 430–432, the curves rise quickly to an initial current plateau, at t=0.2 μsec (442), where a hole-carrier-mediated steady state current continues up to t=0.75–1.0 μsec (444), the exact length of the steady-state-current interval depending on the applied voltage, with higher-applied-voltages having shorter times. At t=0.75–1.0 μsec (444), the conductivity rapidly rises to a peak conductivity at time t=1.0–1.2 μsec (446) before precipitously dropping back to essentially a non-conductive state. It is especially noteworthy that the precipitous drop in conductivity is generally irreversible.

The time and voltage conditions in the plateau region are conditions under which the rate of conductivity change is small. Repeated application of very small voltages, or application of a large voltage for a time less than the time required for rapid conductivity increase, were initially assumed incapable of producing an irreversible conductivity change. On the other hand, for application of larger voltages for longer periods of time (444 and 446 in FIG. 4E), the conductivity exhibits a rapid, permanent change. For example, even one exposure of the device to a 12V pulse longer than the time interval 444 in FIG. 4E results in a large permanent decrease in the conductivity. If the organic-polymer layer has previously been subjected to a voltage of sufficient magnitude and duration to generate the brief, high-conductivity state and ensuing precipitous conductivity decline, then when voltage is again applied, no or low conductivity is exhibited for the entire time range.

The time to reach the maximum conductivity, for a given organic-polymer layer not previously exposed to a sufficient applied voltage to exhibit the highly conductive state, may depend on the applied voltage, film thickness, film area, and chemical composition and state of the organic-polymer layer. The switching time for the irreversible transformation of the organic-polymer layer from a high conductivity to a low conductivity state is relatively rapid. The highly conductive state has a sufficiently large conductivity to insure a good signal-to-noise ratio for distinguishing between a low and high conductive state. In order to have such good signal-to-noise ratio, a rapidly measurable current needs to be passed through a device of submicron area. Submicron devices are required to obtained high density memories. Measurable currents are needed so that the highly conductive state of the memory can be distinguished in timescales compatible with current memory applications, including video applications. Typically for such device areas and timescales, the highly conductive state must pass greater than 100 A/cm$^2$. The well-defined and high contrast difference between bistable states suggests that the organic-polymer layer, in the described embodiment a PEDT/PSS layer, is an excellent candidate for an information-storage layer within an electronic memory.

Figure 5A:
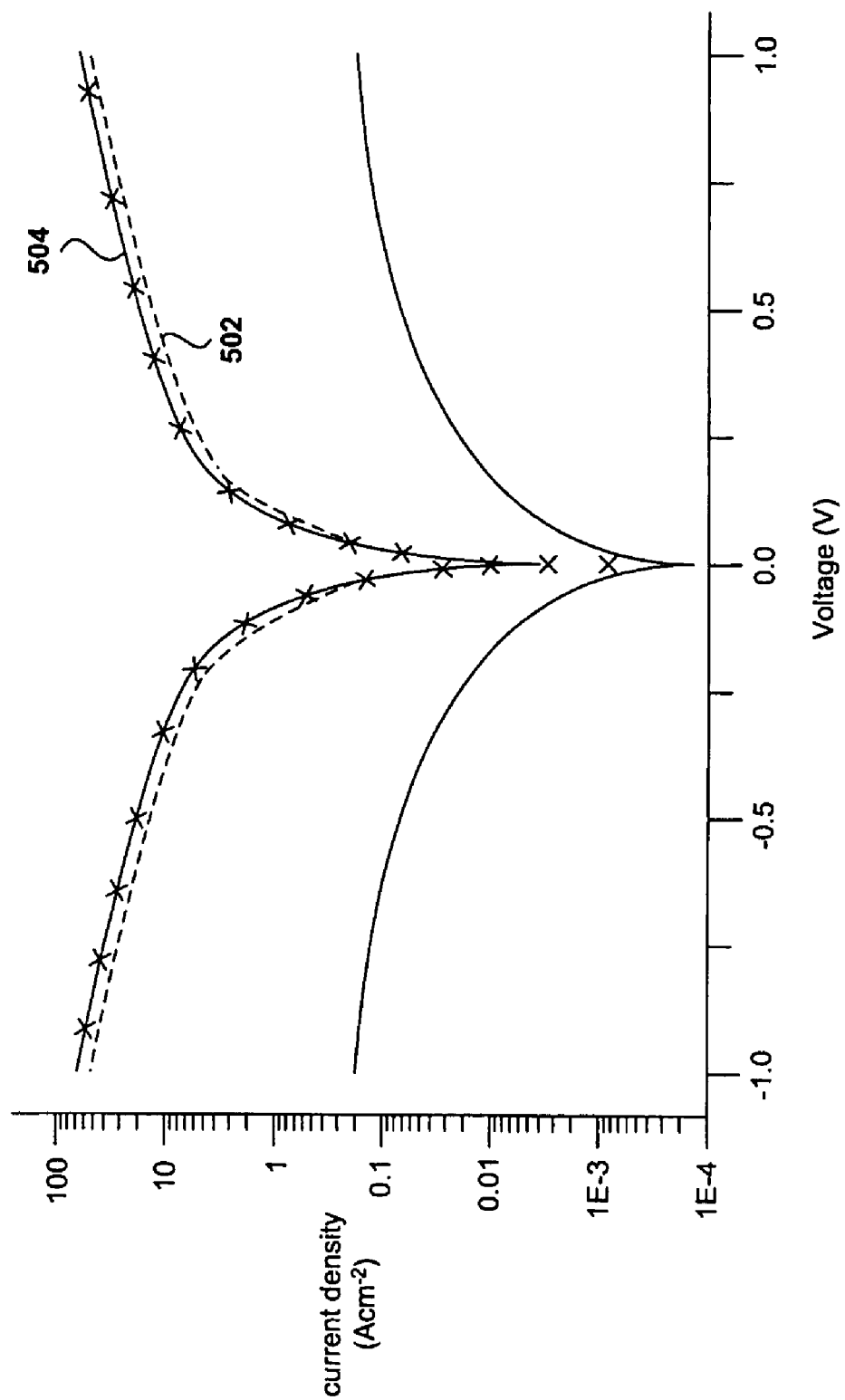
FIGS. 5A–B illustrate the instability of the organic-polymer layer to repeated READ access operations.
Figure 5B:
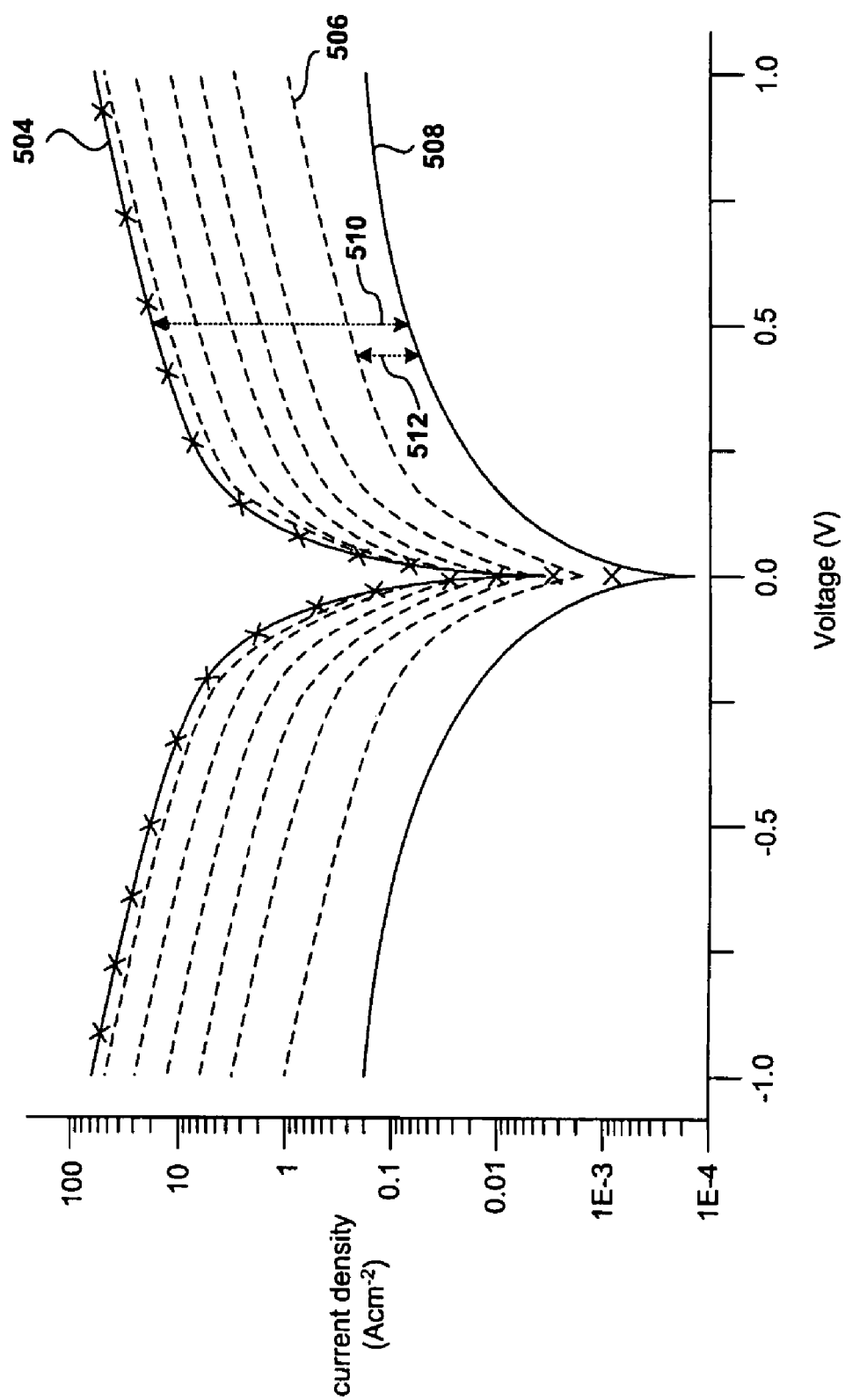

As discussed above, investigations of organic-polymer-based memory elements, such as the memory element shown in FIG. 1, have revealed that the high conductivity organic-polymer-layer state is not necessarily stable with respect to repeated READ access operations, and therefore exhibits a response, at low applied voltages, reminiscent of the linear response shown in FIG. 4A. FIGS. 5A–B illustrate the instability of the organic-polymer layer to repeated READ access operations. As shown in FIG. 5A, even after a small number of READ access operations, the current-density/voltage relationship for the organic-polymer layer may show a decreased current-carrying capacity 502 for all applied voltages with respect to the current-carrying capacity 504 of the organic-polymer layer prior to exposure to high voltage potentials. As shown in FIG. 5B, over many repeated READ access operations, the current-carrying capacity of the organic-polymer layer may steadily decrease from an initial current-carrying capacity 504 to a current-carrying capacity 506 not much greater than the low-conductivity state 508 of the organic-polymer layer following application of a WRITE-access, high voltage potential, opr WRITE threshold. As the current-carrying capacity of the organic-polymer layer degrades, the current-density difference, initially large 510, steadily decreases to smaller and smaller values 512. After some number of information-storage-access operations, the conductivity state of the organic-polymer layer may not be differentiable from that of the low conductivity state induced by exposure of the organic-polymer layer to a high-voltage spike during the course of a WRITE access operation.

Figure 6:
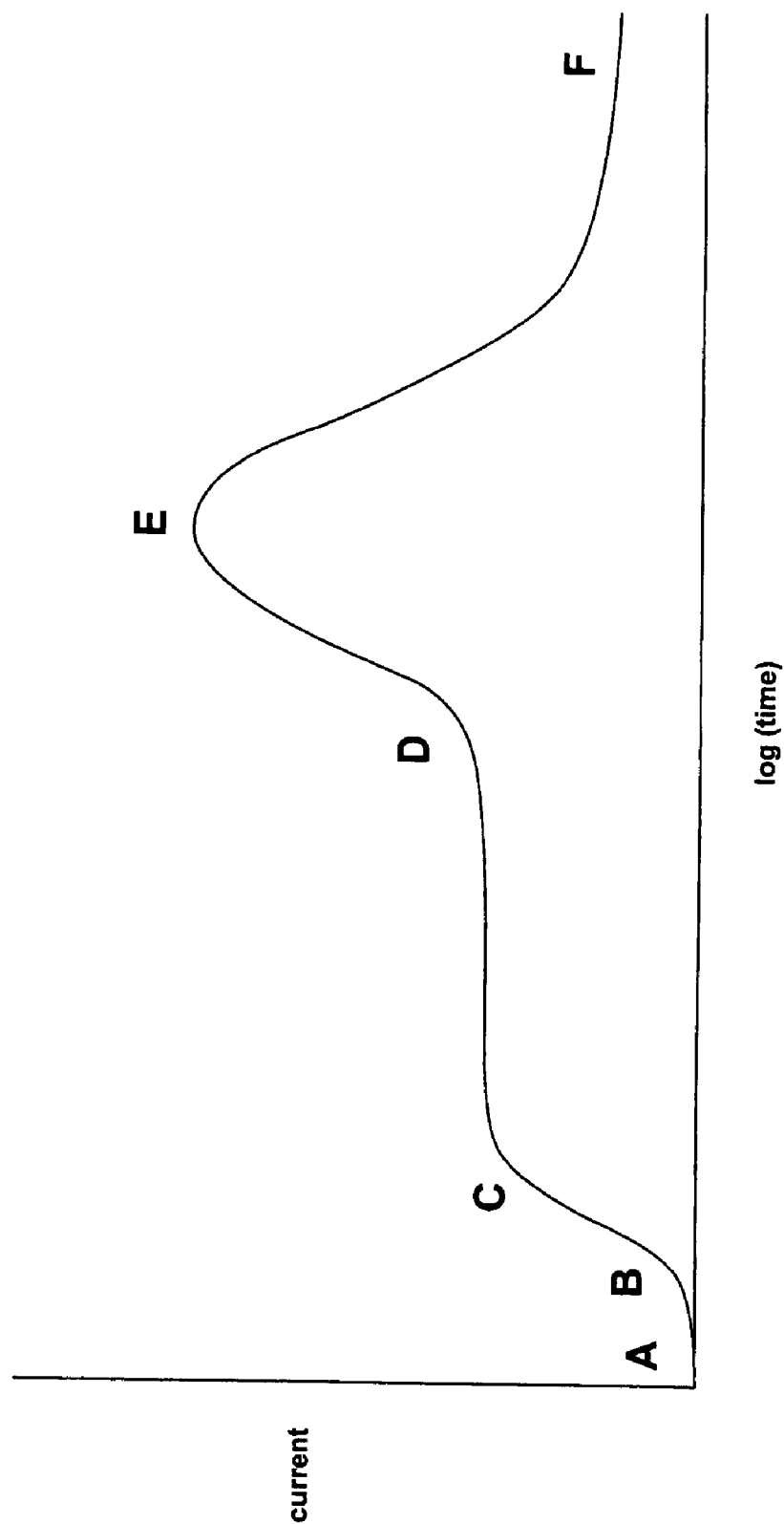

FIGS. 6, 7A–F, and 8A–F illustrate the physical processes that occur in the PEDT/PSS organic-polymer layer when voltage is applied to the PEDT/PSS organic-polymer layer. FIG. 6 shows an idealized, current-density-response-to-applied-voltage curve, similar to the curves shown in FIG. 4E. The various stages in the current density response to an applied voltage are labeled in FIG. 6 as A–F, representing: (A) no applied voltage; (B) initial fractions of a microsecond following application of a voltage, as the hole-carrier-mediated current rises to a steady state hole-carrier-mediated current; (C and D) endpoints of the steady state hole-carrier-mediated current; (E) a peak current at a time that depends on the magnitude of the applied voltage; and (F) an essentially non-conductive state following a precipitous drop in conductivity after the peak conductivity. FIGS. 7A–F show the highest-occupied-molecular orbital ("HOMO") and lowest-unoccupied-molecular orbital ("LUMO") energy diagrams for the organic-polymer layer at the above-described points A–F in FIG. 6, and FIGS. 8A–F show a representation of the hole-carrier and electron presence and movement within the organic-polymer layer at the above-described points A–F in FIG. 6. FIGS. 6, 7A–F, and 8A–F are therefore discussed together, below.

Figure 8A:
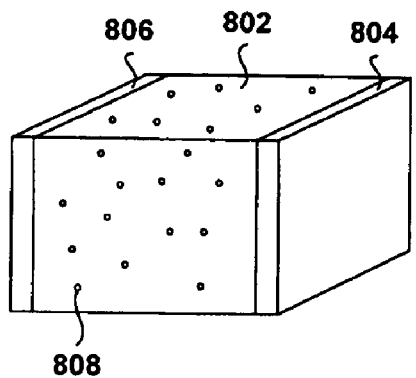

FIGS. 7A and 8A show the initial, post-manufacturing state of the PEDT/PSS organic-polymer layer within a simple three-layer device, prior to application of a voltage across the electrodes. In FIG. 8A, the organic-polymer layer 802 is sandwiched between two electrodes 804 and 806. Being a p-type semiconductor, the organic-polymer layer 802 includes a number of hole carriers, such as hole carrier 808, that represent unfilled valence-band orbitals that can accommodate additional electrons. In FIGS. 7A–F and 8A–F, hole carriers are shown as unfilled disks, and electrons are shown as filled disks. Exchange of an electron and a hole by neighboring molecules or unsaturated bonds within a polymer result in a displacement of the hole and carrier. In an electric field, holes may be preferentially displaced in one direction, and electrons in the opposite direction, along the field lines. Thus, electric current may be carried by holes, electrons, or by both holes and electrons within a material. In FIG. 7A, the tightly spaced, in energy, molecular orbitals of the organic-polymer layer form hybrid HOMO and LUMO bands 702 and 704 across the width of the organic-polymer film 706, between an electronegative electrode 708 and an electropositive electrode 710. For electron flow, electrons need to be promoted from the molecular-subunit-or-bond-centered HOMO band to the delocalized LUMO band. The LUMO band 704 is higher in energy than the LUMO band 704 across the width of the organic-polymer film, where energy increases vertically in the diagram, and there is no field or force to promote HOMO electrons to the LUMO band in order to facilitate electron flow.

Figure 8B:
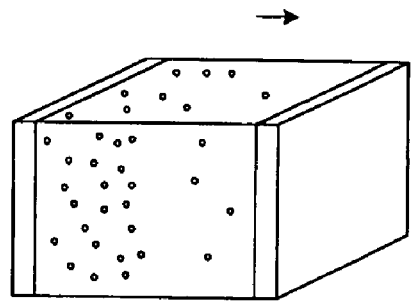

FIGS. 7B and 8B show the organic-polymer layer immediately following application of a voltage potential to the electrodes. As shown in FIG. 7A, application of a voltage potential across the electrodes effectively raises the energy of the LUMO and HOMO bands at the negative electrode interface with respect to the LUMO and HOMO bands at the positive electrode interface, establishing a field through the organic-polymer layer along which hole carriers begin to move, from the electropositive electrode towards the electronegative electrode. As shown in FIG. 8B, holes are injected into the organic-polymer layer from the electropositive electrode, and a hole gradient is established within the organic-polymer layer.

Figure 8C:
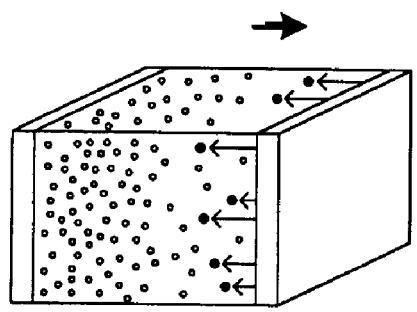
Figure 8D:
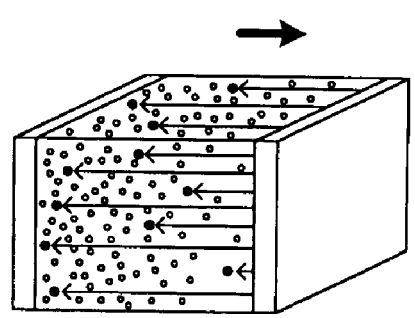

FIGS. 7C and 8C show the organic-polymer layer following application of a voltage potential to the electrodes, as a steady state hole-carrier-mediated current flow is established at point C in FIG. 6. As shown in FIG. 7B, the hole-carrier gradient established by application of the voltage potential across the electrodes begins to sufficiently lower the barrier to allow electrons to jump from the electropositive electrode to the LUMO band. Notice that the energy difference between the electronegative-electrode-interface HOMO and the electropositive-electrode-interface LUMO further decreases, allowing for transition of electrons from the HOMO band to the LUMO band within the organic-polymer layer, facilitating electron flow through the organic-polymer layer. As shown in FIG. 8C, holes continue to be injected into the organic-polymer layer from the electropositive electrode, at a higher rate due to the influx of electrons into the region of the organic-polymer layer adjacent to the electronegative electrode. Electrons have a much lower mobility in the organic-polymer layer than holes, and therefore, as shown in FIGS. 6, 7D, and 8D, an appreciable time elapses from the establishment of the steady state hole-carrier-mediated current flow and the point D in FIG. 6 at which current flow begins to steeply climb.

Figure 8E:
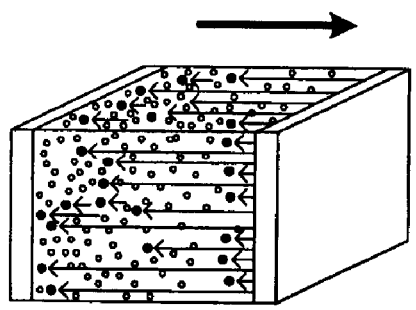

FIGS. 7E and 8E show that the inflowing electrons reduce the hole space charge and permit more holes to be injected at the electropositive contact. Current flow sharply increases to point E in FIG. 6. For a short, peak interval, electron-mediated and hole-carrier-mediated current begins to freely flow through the organic-polymer layer, as shown in FIG. 8E.

Figure 8F:
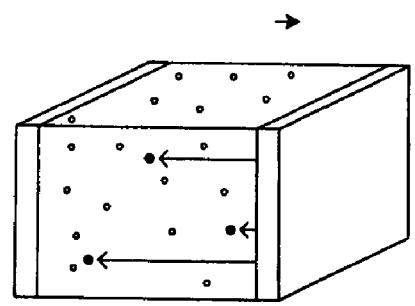

However, soon after reaching peak conductivity, the organic-polymer layer begins to undergo chemical modification, to be discussed below, that precipitously and irreversibly decreases the current-carrying capacity of the organic-polymer layer. As discussed below, the influx of electrons into the organic-polymer layer irreversibly degrades the current carrying capacity of the organic-polymer layer. FIGS. 7F and 8F show the organic-polymer layer, following application of a voltage potential to the electrodes, as current flow precipitously decreases to point F in FIG. 6. As shown in FIG. 7F, changes in the organic-polymer layer disrupt the delocalized molecular-orbital bands in the organic-polymer layer. The electronegative-electrode-interface HOMO is again at lower energy than the electropositive-electrode-interface LUMO. Neither hole-mediated current nor electrons can freely traverse the electronegative-electrode-interface HOMO is now at higher energy than the organic-polymer layer. The peaks and valleys represent barriers to carrier transport within the material. As shown in FIG. 8F, current decreases, and subsequently, the organic-polymer layer becomes essentially non-conductive.

Figure 9:
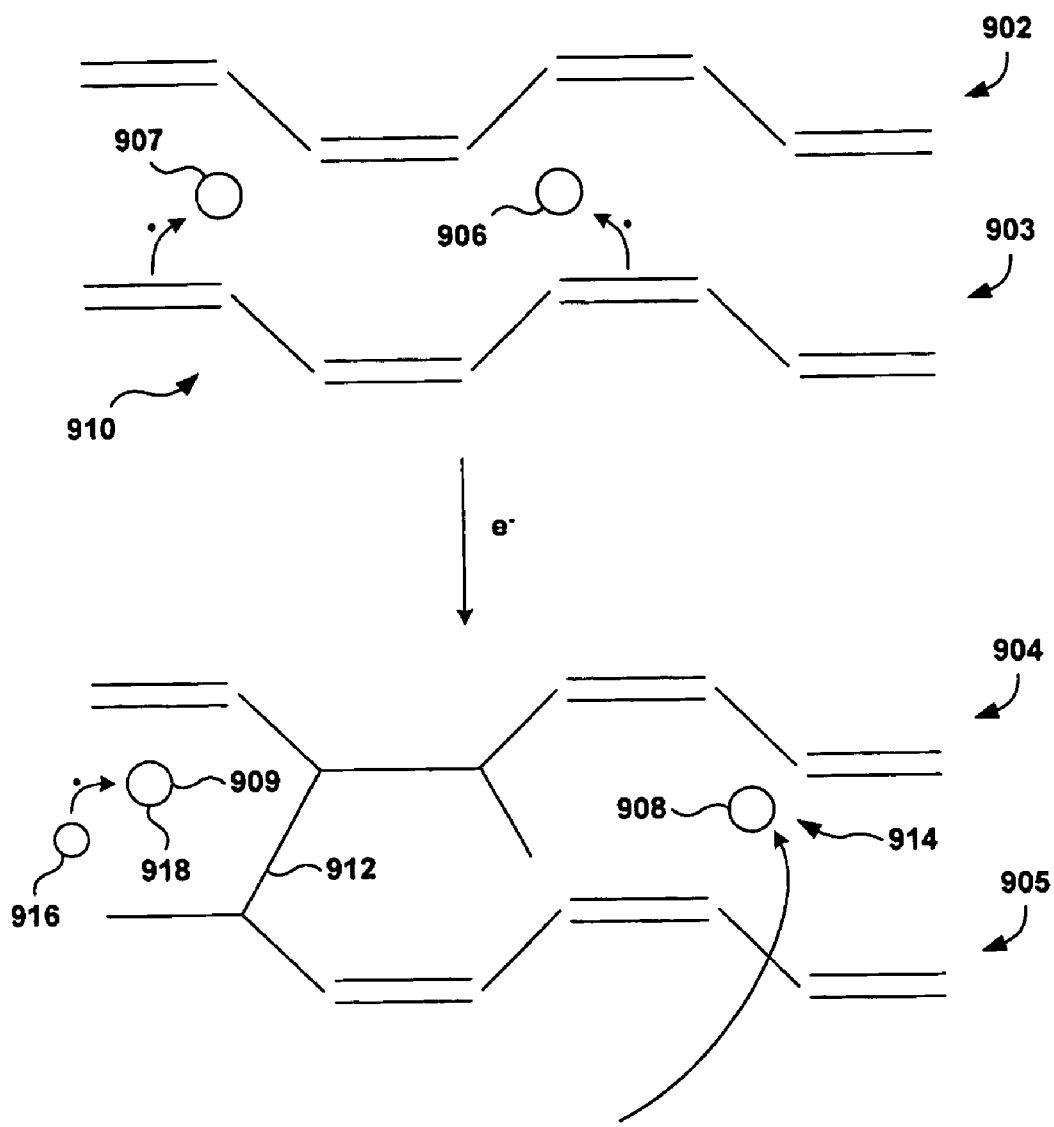
FIG. 9 illustrates some of the mechanisms considered to be involved in the high-voltage-potential degradation of the current-carrying capacity of the organic-polymer layer.

FIG. 9 illustrates some of the mechanisms considered to be involved in the high-voltage-potential degradation of the current-carrying capacity of the organic-polymer layer. Semiconducting and conducting organic polymers generally rely on delocalized $\pi$ electrons through highly conjugated backbones to produce the molecular orbitals through which current is carried. Thus, in FIG. 9, the organic polymer is abstractly represented by parallel conjugated backbones 902–905. The organic-polymer layer is generally doped with electron-deficient atoms or compounds, represented in FIG. 9 by unfilled circles 906–909. In the initial, post-manufacturing, high-conductivity state 910, the dopant components extract electrons from the polymer to create hole carriers or, in other words, unfilled valence-band orbitals. However, when a high voltage is applied to the organic polymer, and electrons flow into the organic-polymer layer in response to the applied voltage, a number of effects deleterious to the current-carrying capacity of the organic-polymer layer occur. Such effects include cross-linking 912 of polymers by additional reactions to unsaturated bonds resulting in covalent bonds between polymers, deactivation of dopants in the organic-polymer layer 914 via reduction by electrons, production of counter-dopant entities 916 that interact with dopants 918 to deactivate the dopants, and by the types of disruptions that decrease hole-carrier mobility within the organic-polymer layer and/or degrade the hole-injecting properties of layers adjoining the organic-polymer layer.

Figure 10:
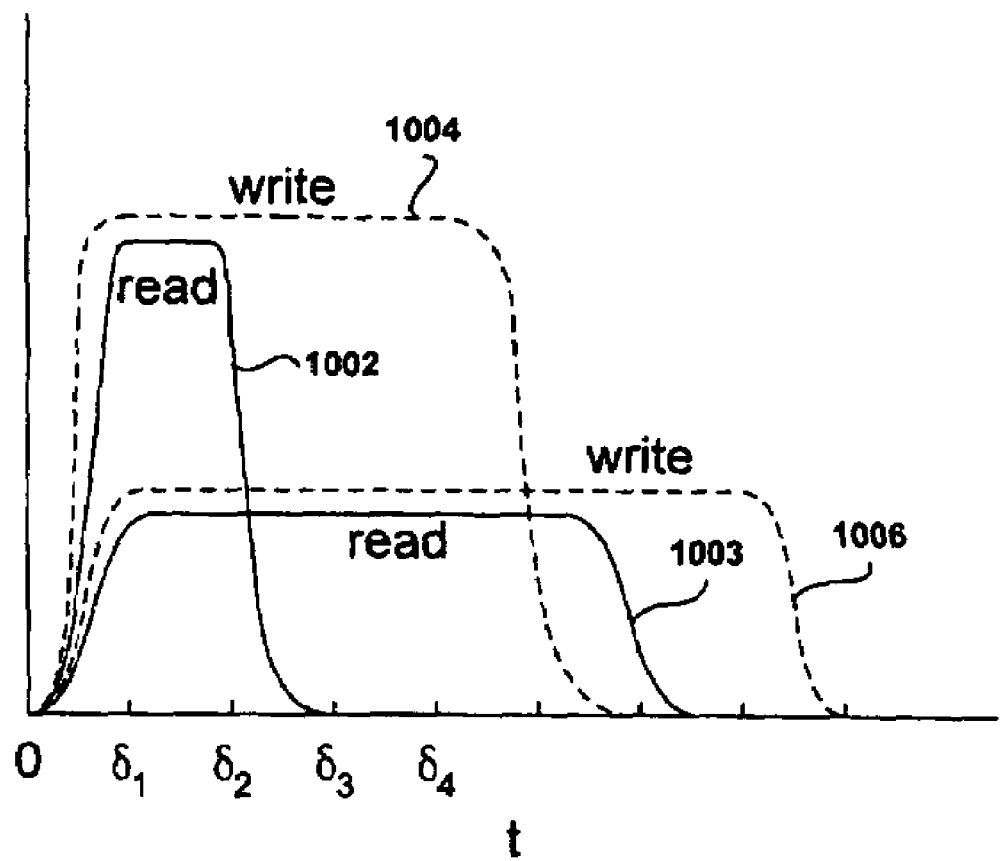
FIGS. 10 and 11 illustrate the two basic techniques that may be employed to increase the stability of memory elements to READ access operations.
Figure 11:
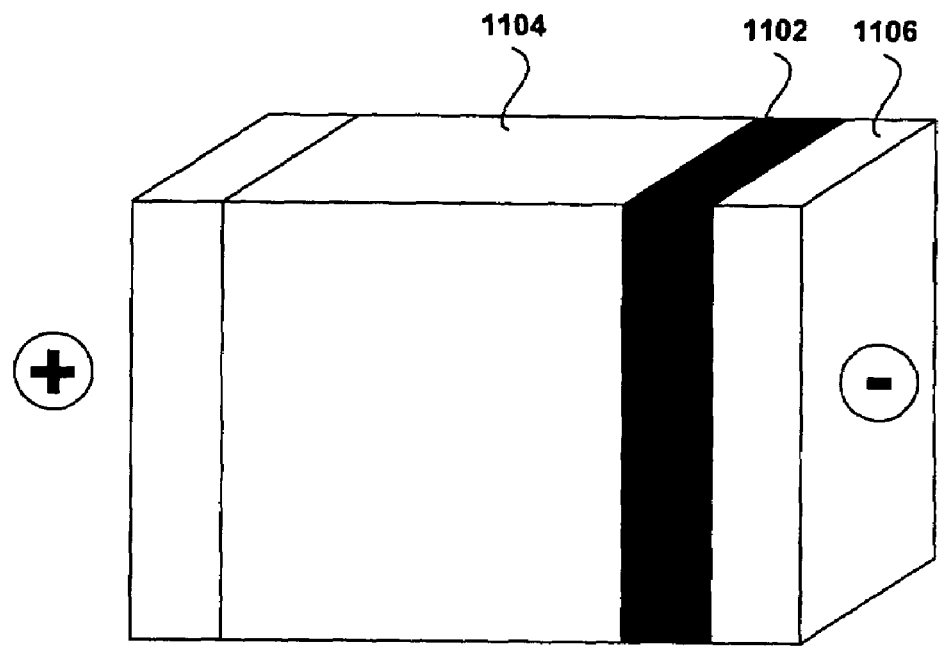

Analysis of the internal state of the organic-polymer during the extremely short time intervals between an initial application of high voltage and degradation of the current-carrying capacity of the organic-polymer layer motivate two basic techniques that can be used alone or in combination to produce more stable memory elements. FIGS. 10 and 11 As shown in FIG. 10, one technique involves decreasing the interval of time over which a large voltage potential is applied to a memory element in order to access the information stored within the memory element. In FIG. 10, the read-access voltage 1002 is applied only for a brief time interval, so that electrons do not have time to be injected into the organic-polymer layer. The time for which the steady state hole-carrier-mediated current may flow through the organic-polymer layer before rapid influx of electrons depends on the relative magnitude of the voltage potential applied to the organic-polymer layer, the electron injecting properties of the negative electrode, the chemical and physical characteristics of the organic polymer layer and neighboring layers and components, and other such factors. However, in general, there is a time interval between application of a voltage potential and introduction of electrons for most organic-polymer conductors. By applying only extremely brief potentials during READ access operations, entry of electrons into the organic-polymer layer can be avoided, in turn avoiding the current-carrying-capacity degradation that results in information corruption after repeated READ access operations, as illustrated in FIGS. 5A–B. Alternatively, longer lower voltage read pulses can be used to also avoid electron injection and irreversible organic-polymer layer modification, as shown in curve 1003 Note, as shown in FIG. 10, that WRITE access operations can be successfully performed by either using relatively high voltage spikes 1004 or by extending lower-voltage spikes 1006 for greater periods of time. In either case, the degradation of the organic-polymer layers current-carrying capacity, as illustrated in FIG. 7E, reliably occurs.

A second technique, representing another embodiment of the present invention, is to introduce an electron-blocking layer between the organic polymer layer and an electrode, as shown in FIG. 11. The electron-blocking layer 1102 serves to significantly increase the barrier to electrons entering the organic polymer layer 1104 from the electronegative electrode 1106. The electron-blocking layer can significantly increase allowable voltage-application times for READ access operations and/or increase allowable voltages for READ access operations. Insertion of the electron-blocking layer serves to prevent electron migration into the organic-polymer layer, and concomitant current-capacity-degradation of the organic-polymer layer, at applied voltage potentials and applied-voltage-potential durations needed for READ access operations. The electron injector layer of the embodiment shown in FIG. 11 may consist of a PEDT-PSS/Au bilayer, or may alternatively consist of a low-work function material, such as calcium or MgAl. An alternative electron injector layer can be fashioned from an n-type polymer.

Figure 12:
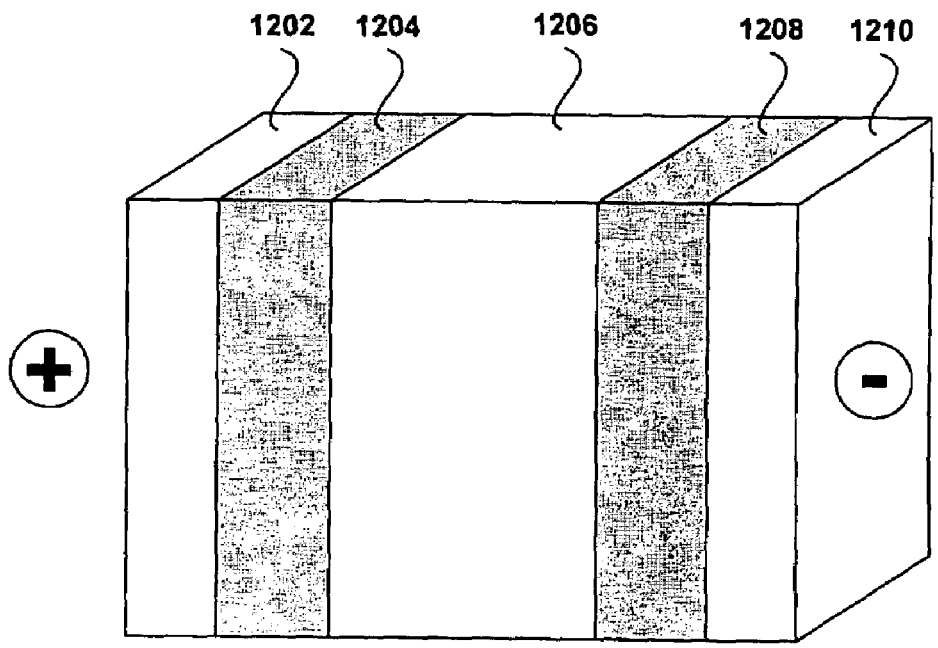
FIG. 12 illustrates a single-memory element.

FIG. 12 illustrates a single-memory element. The embodiment shown in FIG. 12 is a single-memory element, capable of storing a binary value by stably remaining in either a high conductivity or low conductivity state. The memory element includes a first electrode 1202, a hole-carrier-injector layer 1204, an organic-polymer layer, such as a PEDT/PSS layer 1206 that readily transports hole carriers without significant changes to current-carrying capacity and that may conduct hole-current densities of 100 amperes/$cm^2$ or more. As discussed above, under high-voltage-potential-inducing injection of electrons into the organic-polymer layer, the current-carrying capacity of the organic-polymer layer is irreversibly degraded. An electron-blocking layer 1208, in one embodiment comprising indium-tin-oxide/PEDT/PSS, serves to significantly increase the voltage-potential barrier to electrons, inhibiting electrons from entering the organic-polymer layer 1206 when a moderate voltage potential is applied to the memory element such that electrode 1210 is electronegative with respect to electrode 1202 but injects electrons when a large potential is applied.

Figure 13:
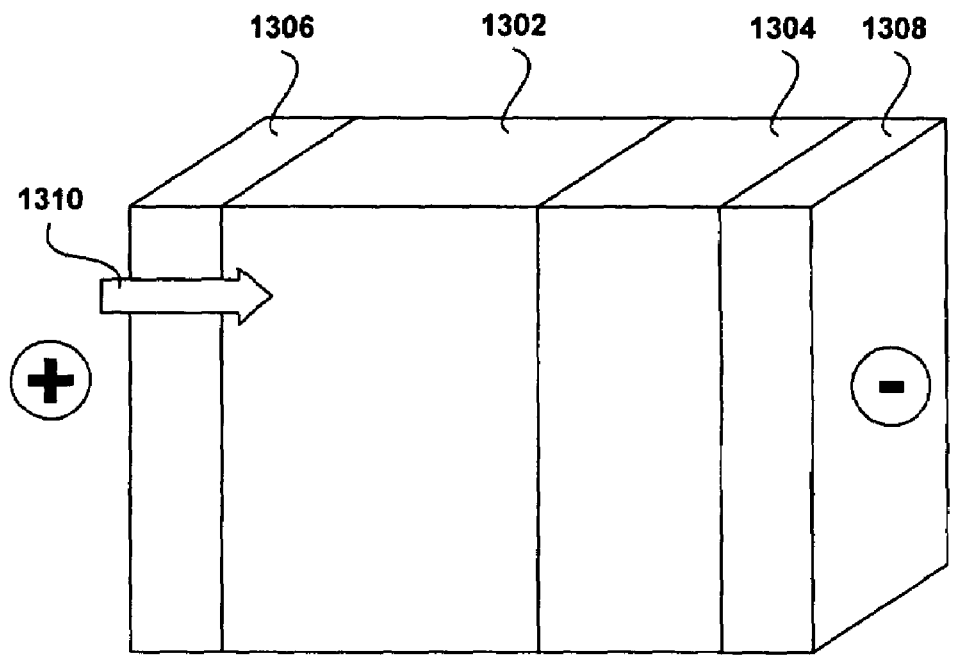
FIGS. 13–14 illustrate an enhanced, organic-polymer memory element.
Figure 14:
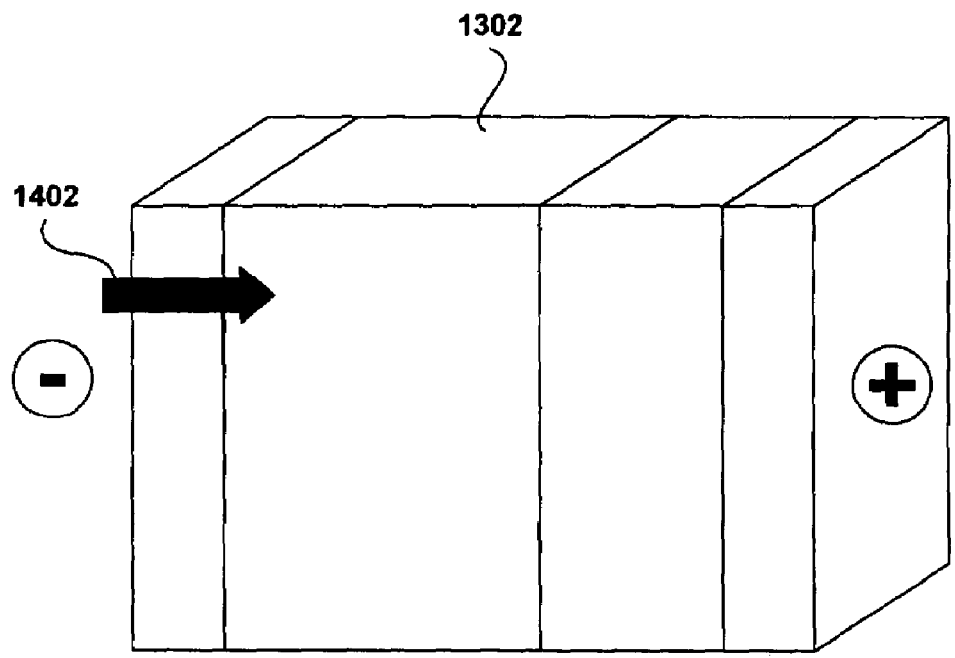

FIGS. 13–14 illustrate an enhanced, organic-polymer memory element. In the alternative embodiment of the present invention, the organic-polymer layer 1302 is sandwiched, along with a both hole-carrier blocking and electron-blocking layer 1304, between two electrodes 1306 and 1308. When a voltage potential of a first polarity, as shown in FIG. 13, is applied to the memory element, a hole-carrier-mediated current is transmitted across the memory element, as indicated by the unfilled arrow 1310 in FIG. 13. However, as shown in FIG. 14, when the polarity of the applied voltage is reversed, electrons flow into the organic polymer layer 1302, as indicated by filled arrow 1402 in FIG. 14. Thus, the memory element may be read using applied voltages of the first polarity, as shown in FIG. 13, and written using applied voltage potentials of the second polarity, shown in FIG. 14. Note that the alternative embodiment illustrated in FIGS. 13–14 would not work in situations in which a diode-type memory element is required but would be appropriate for example if transistor addressing within an array of such memory elements were used.

Although the present invention has been described in terms of a particular embodiment, it is not intended that the invention be limited to this embodiment. Modifications within the spirit of the invention will be apparent to those skilled in the art. For example, various chemical modifications of either or both of the PEDT and PSS polymers may confer various desirable advantages to electronic memory elements and high-density electronic memories based on a conductive organic polymer layer. Various different polymer lengths and different ratios of PEDT to PSS, as well as different ionization states of functional groups within the polymers, may be employed to favorably alter both properties of a PEDT/PSS layer. Moreover, other types of conductive organic polymers may be used, including organic polymers produced by current research in conductive organic polymers. Any of the various modified PEDT/PSS mixtures, or other conductive organic polymers or materials used for the transformable, conductive organic layer of the memory element needs to exhibit the above-described relatively highly conductive state at relatively low voltages, that can be transformed, upon application of a relatively high voltage spike, to a low-conductivity state that is easily distinguished from the relatively highly conductive state. Many different types of architectures for high-density electronic memories may be employed to incorporate memory elements of the present invention. Cross-bar-like matrix architectures may prove to be of great efficiency and effectiveness, but other types of architectures may prove equally effective. The dimensions of the electronic-memory elements and the densities of electronic memories fabricated from them are constrained only by available fabrication techniques and the practically useful resistances exhibited by microscopic signal lines. For example, should nanoscale fabrication techniques prove practical, and the resistivity of nanoscale signal lines prove sufficiently low, nanoscale sized electronic memory elements may be fabricated by the techniques described above. While two-dimensional arrays and matrixes provide reasonable high density memories for current consumer-product applications, future electronic memories may incorporate additional layers of electronic memory elements, thus constituting a three-dimensional volume of electronic memory elements.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An organic polymer memory element stable to repeated WRITE and READ operations, the organic polymer memory element comprising:
    a first electrode;
    a second electrode;
    a conductive organic polymer layer between the first electrode and the second electrode, the conductivity of which detectably decreases following introduction of electrons under applied voltage potential;
    the memory element repeatedly written by application of a WRITE threshold to place the organic polymer layer into a first conductivity state, the WRITE threshold one of
    a relatively high-voltage voltage potential, and
    a relatively long-duration voltage potential; and
    the memory element repeatedly read by application of a READ threshold to place the organic polymer layer into a second conductivity state, the READ threshold a relatively low voltage potential for a length of time less than a time needed for electrons to enter the organic polymer layer following application of a voltage potential to the electrodes.

2. The organic polymer memory element of claim 1 further including an electron-blocking layer between one of the two electrodes and the organic polymer layer, the electron blocking layer raising the voltage potential needed to inject electrons from the adjacent electrode through the electron-blocking layer into the organic polymer layer.

3. The organic polymer memory element of claim 1 further including an electron-blocking layer between one of the two electrodes and the organic polymer layer, the electron blocking layer having a voltage threshold for electron injection below which few electrons are injected and above which electrons are readily injected.

4. The organic polymer memory element of claim 3 further including a hole injection layer that increase the hole injection rate upon trapping electrons.

5. The organic polymer memory element of claim 1 further including an electron-blocking layer between one of the two electrodes and the organic polymer layer, the electron blocking layer having a time delay for electron injection.

6. The organic polymer memory element of claim 1 further including an indium-tin-oxide/PEDT-PSS layer electron-blocking layer.

7. The organic polymer memory element of claim 1 further including an electron-and-hole blocking layer between one of the two electrodes and the organic polymer layer, the electron-and-hole blocking layer raising the voltage potential needed to inject electrons from the adjacent electrode through the electron-blocking layer into the organic polymer layer when a voltage potential of a first polarity is applied to the memory element, and raising the voltage potential needed for hole injection into the organic polymer layer when a voltage potential of a second, opposite polarity is applied to the memory element.

8. The organic polymer memory element of claim 1 used for each element of an array of memory elements.

9. The organic polymer memory element of claim 1 used for each element of an array of memory elements employed in a polymer-based electronic device selected from among:
    an electronic memory;
    a processor;
    a controller;
    an image recording device;
    an audio recording device; and
    an electronics communication device.

10. A method for operating an organic-polymer-based memory element including an organic polymer layer between two electrodes, the method comprising:
    determining a threshold the length of application of a relatively low voltage potential to the memory element during which no electrons are injected into the organic polymer layer; and
    when applying a relatively low voltage potential to the memory element to read the conductivity state of the organic polymer layer, applying the relatively low voltage potential to the memory element for a time less than the determined threshold.

11. The method of claim 10 further including:
    introducing an additional electron blocking layer between an electrode and the organic polymer layer.

12. A method for operating an organic-polymer-based memory element including an organic polymer layer between two electrodes, the method comprising:
    identifying an electron-blocking substance;
    introducing an additional electron blocking layer between an electrode and the organic polymer layer comprising the identified electron-blocking substance.

13. The method of claim 12 further including:
    determining a threshold the length of application of a relatively low voltage potential to the memory element during which no electrons are injected into the organic polymer layer; and
    when applying a relatively low voltage potential to the memory element to read the conductivity state of the organic polymer layer, applying the relatively low voltage potential to the memory element for a time less than the determined threshold.

14. The method of claim 12 wherein the electron blocking layer raises the voltage potential needed to inject electrons from the adjacent electrode through the electron-blocking layer into the organic polymer layer.

15. The method of claim 12 wherein the electron blocking layer has a voltage threshold for electron injection below which few electrons are injected and above which electrons are readily injected.

16. The method of claim 12 wherein the electron blocking layer has a time delay for electron injection.

17. An organic polymer memory element included in an electronic device comprising:
    a first electrode;
    a second electrode;
    a conductive organic polymer layer between the first electrode and the second electrode, the conductivity of which detectably decreases following introduction of electrons under applied voltage potential, the memory element repeatedly writable by application of a WRITE threshold to place the organic polymer layer into a first conductivity state and repeatedly readable by application of a READ threshold to place the organic polymer layer into a second conductivity state; and an electron-blocking means.

18. The organic polymer memory element of claim 17 wherein a WRITE threshold is one of:
 a relatively high-voltage voltage potential; and
 a relatively long-duration voltage potential.

19. The organic polymer memory element of claim 17 wherein a READ threshold is a relatively low voltage potential for a length of time less than a time needed for electrons to enter the organic polymer layer following application of a voltage potential to the electrodes.

20. The organic polymer memory element of claim 17 wherein the electron-blocking means is an electron-blocking layer between one of the two electrodes and the organic polymer layer, the electron blocking layer raising the voltage potential needed to inject electrons from the adjacent electrode through the electron-blocking layer into the organic polymer layer.

21. The organic polymer memory element of claim 17 wherein the electron-blocking means is an electron-blocking layer between one of the two electrodes and the organic polymer layer, the electron blocking layer having a voltage threshold for electron injection below which few electrons are injected and above which electrons are readily injected.

22. The organic polymer memory element of claim 17 wherein the electron-blocking means is an electron-blocking layer between one of the two electrodes and the organic polymer layer, the electron blocking layer having a time delay for electron injection.

23. The organic polymer memory element of claim 17 wherein the electron-blocking means is an electron-and-hole blocking layer between one of the two electrodes and the organic polymer layer, the electron-and-hole blocking layer raising the voltage potential needed to inject electrons from the adjacent electrode through the electron-blocking layer into the organic polymer layer when a voltage potential of a first polarity is applied to the memory element, and raising the voltage potential needed for hole injection into the organic polymer layer when a voltage potential of a second, opposite polarity is applied to the memory element.

* * * * *